United States Patent [19]

Rosenbluth et al.

[11] 4,356,413
[45] Oct. 26, 1982

[54] MOSFET CONVOLVED LOGIC

[75] Inventors: William Rosenbluth; Thomas A. Williams, both of Reston, Va.

[73] Assignee: IBM Corporation, Armonk, New York

[21] Appl. No.: 179,847

[22] Filed: Aug. 20, 1980

[51] Int. Cl.³ .............. H03K 19/003; H03K 19/017; H03K 19/173; G01R 15/12
[52] U.S. Cl. .................. 307/443; 307/242; 307/243; 307/463; 307/468; 324/73 R
[58] Field of Search .............. 307/443, 448, 449, 450, 307/463, 465, 468, 469, 577, 584, 585, 243, 205, 251, 241, 242; 324/73; 365/201, 230, 231, 51, 63, 72

[56] References Cited

U.S. PATENT DOCUMENTS

| 3,969,638 | 7/1976 | Marchetti et al. | 307/243 |
| 4,069,430 | 1/1978 | Masuda | 307/450 X |
| 4,084,152 | 4/1978 | Long et al. | 307/468 X |
| 4,177,452 | 12/1979 | Balasubramanian et al. | 307/468 X |
| 4,204,633 | 5/1980 | Goel | 324/73 R X |
| 4,216,389 | 8/1980 | Carter | 307/448 X |
| 4,233,524 | 11/1980 | Burdick | 307/468 |

FOREIGN PATENT DOCUMENTS 2447963 4/1976 Fed. Rep. of Germany ...... 307/465

OTHER PUBLICATIONS

McKenny, "Depletion-Mode Devices Hike Speed of MOS Random Access Memory", Electronics; pp. 80-85; 2-1971.

Primary Examiner—Larry N. Anagnos
Attorney, Agent, or Firm—John E. Hoel

[57] ABSTRACT

A generic FET logic circuit topology is disclosed which employs non-thresholded path routing to eliminate logic transition times in the critical data path. Non-threshold logic performs logic operations with non-inverting unity gain OR and AND functions. The propagation time through the logic matrix is therefore similar to the delay through a chain of linear amplifiers, as contrasted to an algebraic accumulation of delays with conventional logic techniques. This results in an N-factor improvement in the power-delay product over conventional techniques, where N is the number of logic operations being performed.

2 Claims, 12 Drawing Figures

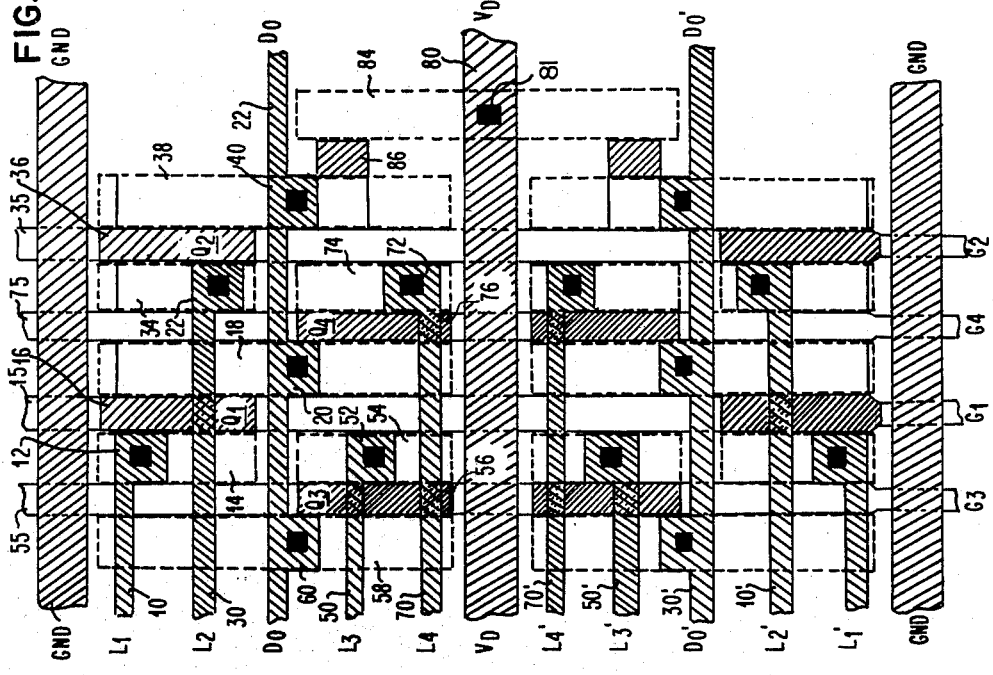

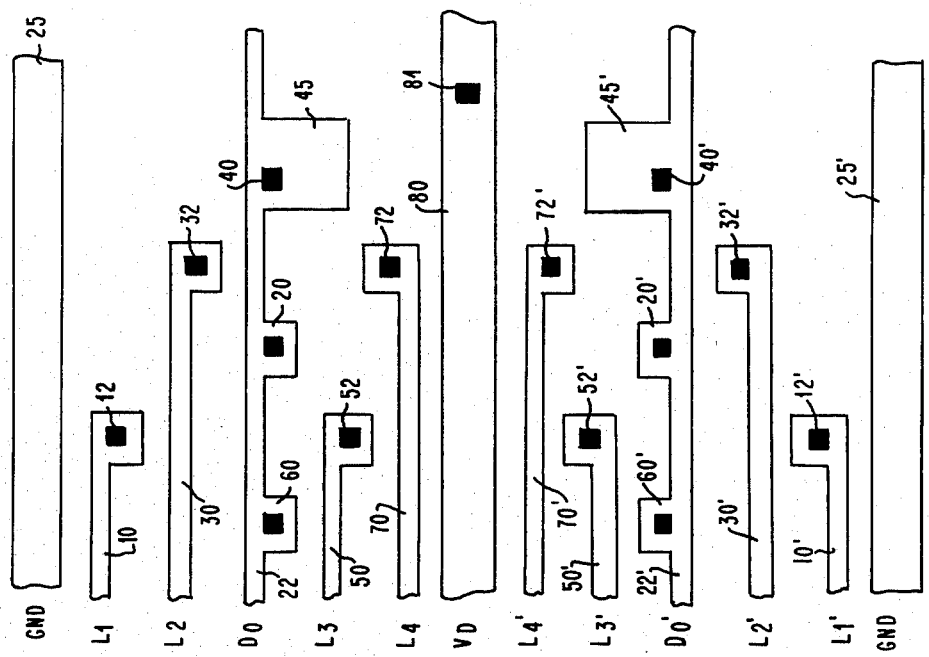
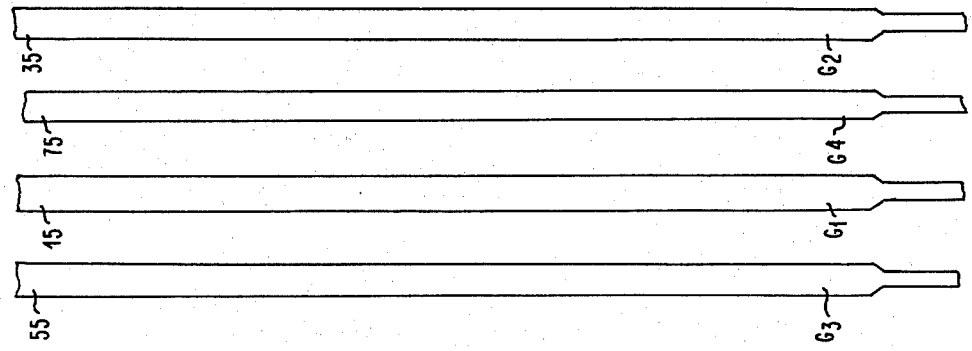

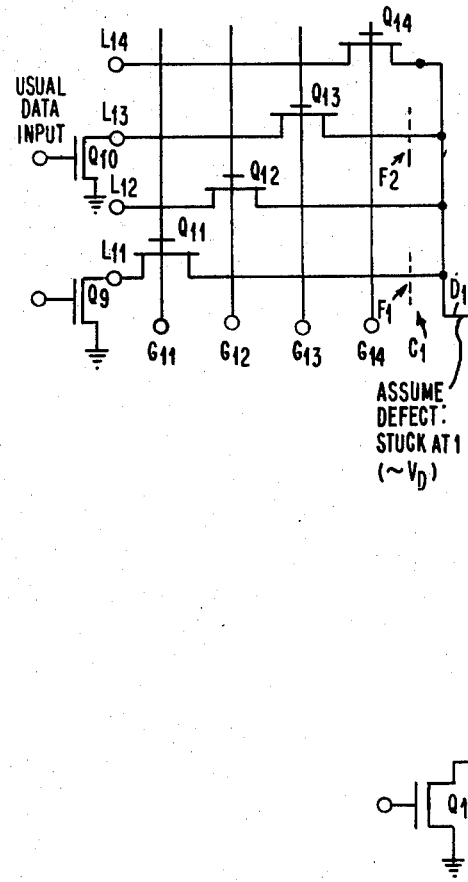
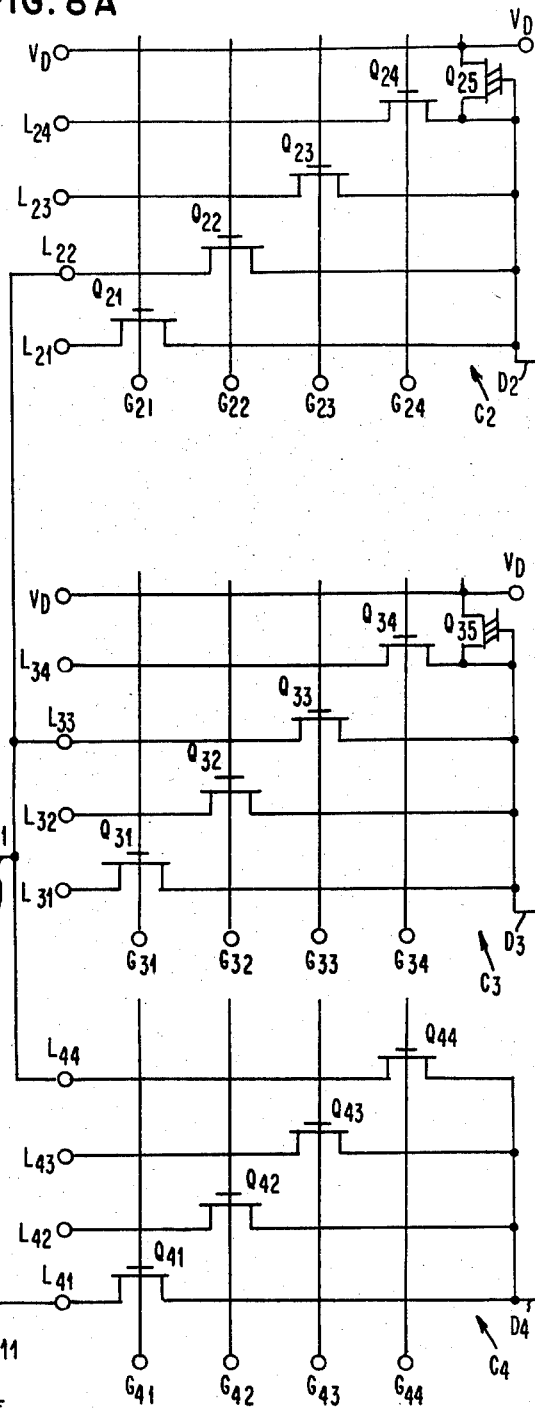
FIG. 8A
FIG. 8

MOSFET CONVOLVED LOGIC

FIELD OF THE INVENTION

The invention disclosed broadly relates to ditigal circuitry and more particularly relates to MOSFET digital logic circuitry.

BACKGROUND OF THE INVENTION

One of the major disadvantages associated with MOSFET inverter circuits has been the relatively poor current driving capability. The MOSFET device is a modulated resistor and consequently MOSFET circuits exhibit large RC time constants, particularly during their turn-on transition when driving capacitive loads.

In combinatorial logic interconnections of FET inverters, the rise time necessary to turn on an inverter device becomes an additive factor when the sequence of such inverters is connected in cascade to perform the logical function. Propagation delays and race conditions come into play in the design of complex logical functions when conventional FET inverter circuit elements are employed.

Since conventional FET inverter circuits employ load devices which dissipate power, the more FET inverter circuits required in a complex logical function, the greater will be a power dissipation for that function. Furthermore, because the load devices in the FET inverters occupy space on the semiconductor chip, their contribution to the device population on a chip is significant.

Standardized FET integrated circuit layouts have been widely used, an example of which is the master slice method. In the master slice method, a standardized array of diffusion shapes is deposited on the wafer with the intention of imparting all circuit personality by means of variations in the location and interconnection of the overlying metallized gates and thin oxide. Master slice has a uniform diffusion pattern. The December 1967 article by A. P. Weinberger in the *IEEE Journal of Solid State Circuits*, Volume SC2, No. 4, pages 182-190, illustrates a master slice method. An FET integrated circuit arrangement is disclosed consisting of a spaced parallel diffusion pattern to be embodied in a semiconducting wafer, with interconnection metallization to be embodied on a higher level. A layout method comprises the steps of repeating the diffusion rows across the chip to form the fixed, master slice diffusion pattern. Wafers with this fixed diffusion pattern are stockpiled for future circuit personalization by means of locating metallized gates thereover. The layout permits but a single degree of freedom in the circuit personalization through the placement of metallized gates over the fixed diffusions forming the FET devices. The method works well for moderate density integrated circuit devices of a low order of the logical complexity, however the inherent lack of flexibility in the location and interconnection of device nets precludes its applicability to high density integrated circuit applications necessarily requiring high level logic functions (combining more than 30 NOR-type primitive circuits into one macro logic function).

OBJECTS OF THE INVENTION

It is therefore an object of the invention to reduce the component count for FET circuits embodying complex logical functions.

It is still another object of the invention to reduce the propagation delay for signals propagating through a complex logical function circuit.

It is still another object of the invention to reduce the power dissipated from an FET complex logical function.

It is still a further object of the invention to reduce the layout area of an FET complex logical function circuit.

It is yet another object of the invention to improve the testability of an FET complex logical function.

SUMMARY OF THE INVENTION

These and other objects, features and advantages of the invention are accomplished by the MOSFET convolved logic invention disclosed herein. A generic FET logic circuit topology is disclosed which employs non-thresholded path routing to eliminate logic transition times in the critical data path. Non-threshold logic performs logic operations with noninverting unity gain OR and AND functions. The propagation time through the logic matrix is therefore similar to the delay through a chain of linear amplifiers, as contrasted to an algebraic accumulation of delays with conventional logic techniques. This results in an N-factor improvement in the power-delay product over conventional techniques, where N is the number of logic operations being performed. The bidirectional conduction characteristics of the FET transfer gates employed in the convolved logic invention enables new testing techniques to be applied to diagnose stuck-fault conditions.

DESCRIPTION OF THE FIGURES

These and other objects, features and advantages of the invention will be more fully appreciated with reference to the accompanying figures.

FIG. 2 is a circuit diagram illustrating how the topology of the basic convolved logic circuit can be duplicated in a symmetric arrangement.

FIG. 3 is a plan view of the circuit layout for FIG. 2.

FIG. 6 shows a plan view of the polycrystalline silicon gate layer for FIG. 3.

FIG. 7 shows a plan view of the metal interconnection line layer for FIG. 3.

FIGS. 8, 8A and 8B show a circuit diagram of a typical complex logic function implemented with the convolved logic invention, showing how it enables new testing techniques to diagnose stuck-fault conditions.

DISCUSSION OF THE PREFERRRED EMBODIMENT

The MOSFET convolved logic invention disclosed herein is an approach allowing a designer maximum flexibility in attaining the highest levels of functional performance per silicon level. It addresses the design from the functional level and allows usage of MOSFET technology to its fullest capability. This is accomplished by extracting the control logic from the data flow path, allowing a structured layout format and the construction of complex logical functions with a minimum of circuitry. The characteristics of the invention are reviewed in all its aspects including its operation, layout schemes, usage in various applications and its approach to testable functions.

The MOSFET convolved logic invention is based upon the principle that the control logic can be taken out of the data path and its control signals can be established so as to have minimal impact on the propagation delays within the data flow. Since this is accomplished, the functional designs minimize device counts and layout complexities.

Figure 1:
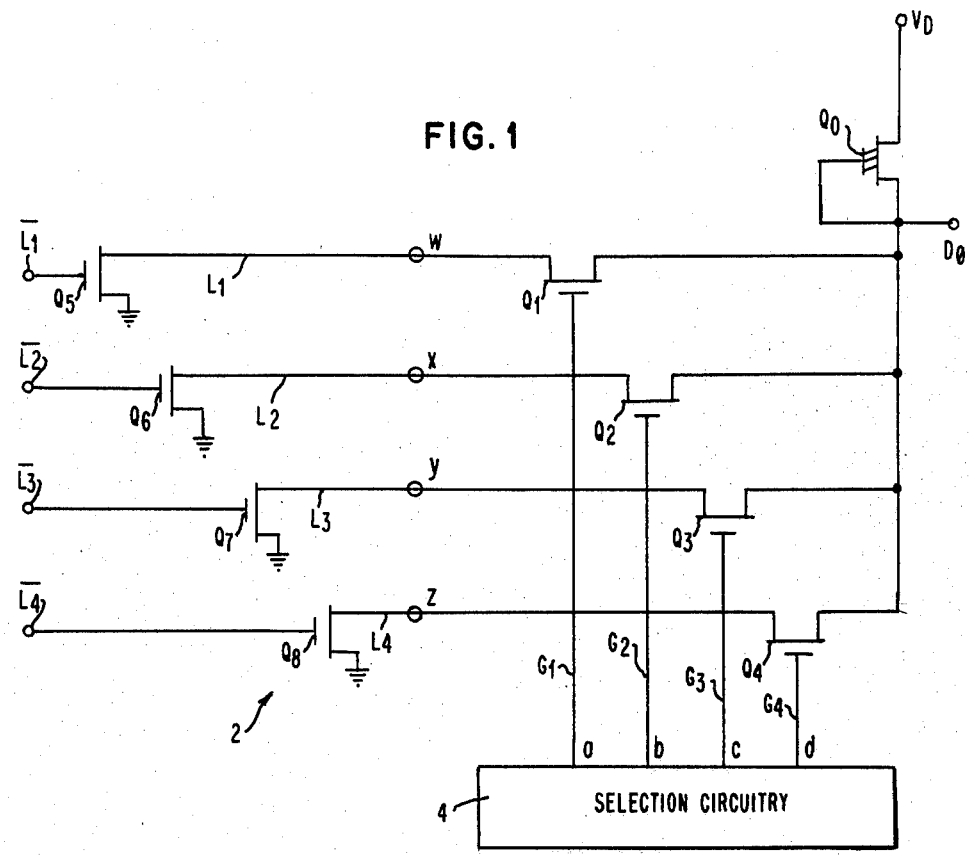
FIG. 1 is a circuit diagram of the basic convolved logic circuit.

The basic convolved logic circuit element is shown in FIG. 1 as an orthogonal arrangement of data transfer lines w, x, y and z and control signal lines a, b, c and d. Active FET device $Q_5$ has the data input $\overline{L1}$ at its gate, its source connected to ground potential and its drain connected to the data line w. The transfer device Q1 has its source-drain path selectively connecting the data transfer line w to the output node $D_0$, in response to the control signal G1 on the control line a. The depletion mode FET device Q0 has its drain connected to the high level potential $V_D$ and provides the up level potential at the output node $D_0$. For N channel FET devices, when the control siganl G1 is positive and the data signal $\overline{L1}$ is positive, a path connecting the output node $D_0$ to ground potential is formed which reduces the output voltage at $D_0$ from $V_D$ to approximately ground potential. The selection circuitry 4 governs the relative potential on the control lines a, b, c and d. If the logical operation to be performed dictates that the potential for G1 is low, then the device Q1 will not be conductive and the data line w will not provide a path to ground for the output node $D_0$.

The basic convolved logic circuit element of FIG. 1 employs a plurality of data transfer lines w, x, y and z and the corresponding plurality of orthogonally oriented control lines a, b, c and d. Data input $\overline{L2}$ is applied to the gate of the active FET device $Q_6$ whose source is connected to ground and whose drain is connected to the data transfer line x. The source-drain path of the transfer device $Q_2$ connects the data transfer line x to the output node $D_0$. The potential of the control signal $G_2$ on the control line b will determine whether the logic state $\overline{L2}$ applied to the gate of the active FET device $Q_6$ will be transferred over the transfer line x to the output node $D_0$. Similar functions are performed by the active device $Q_7$ for the logical input $\overline{L3}$ to transfer the data over the line y via the transfer device $Q_3$ to the output node $D_0$. Similarly, active device $Q_8$ has its gate connected to the logical input $\overline{L4}$ providing a selected path to ground for the data transfer line z through the transfer device $Q_4$ to the output node $D_0$. The logical operation to be performed by the basic convolved logic circuit element 2 of FIG. 1 is determined by the selection circuitry 4 which can be for example a decoder as is illustrated in the *IBM Technical Disclosure Bulletin* of April 1980, page 5024 entitled "Decoding Circuit." One of the advantages of the basic convolved logic elementary circuit shown in FIG. 1 arises from an absence of control logic levels in the data signal path. The data signals transferred along the transfer lines w through z are transferred according to the selection of the control lines a through d and the resultant function appears at the output data node $D_0$. The absence of control logic levels minimizes the turn on delay of consecutive logic stages, a problem which confronts the prior art cascaded inverter logic, for example.

Another advantage in the basic convolved logic elementary circuit shown in FIG. 1 arises from the orthogonal orientation of the data signal flow L1–L4 with respect to the control signal flow G1 through G4. The practice of maintaining the data signal flows perpendicular with respect to the control signal flows lends the invention to a simplified, high density layout approach as is illustrated in FIGS. 2 through 7. The schematic circuit diagram of FIG. 2 is of a dual four-input multiplexer which employs two convolved logic elements such as is shown in FIG. 1, laid out in a bilateral symmetric form. The circuit shown in FIG. 2 has omitted the active devices Q5, Q6, Q7 and Q8 from the depiction in FIG. 2 to simplify the representation. The input terminals L1 through L4 in FIG. 2, for example, could be connected to either active devices Q5-8, etc. for example or could alternately be connected to the outputs D of prior logical circuits. The circuit topology in FIG. 2 is for a dual four-input multiplexer where the lower half of the circuit shown with primed reference numbers and reference letters correspond to the unprimed counterparts in the upper half of the circuit. The purpose of providing the illustration of the dual four-input multiplexer in FIG. 2 is to show how the natural symmetries of the basic convolved logic element of FIG. 1 enable the construction of high density complex logical functions. A composite plan view of the circuit of FIG. 2 is shown in FIG. 3 where four levels of FET device components are shown combined, namely the bottom level 1 of diffusions shown separately in FIG. 4, the next level 2 of the thin gate insulator layer shown separately in FIG. 5, the next level 3 of the polycrystalline silicon lines and gates shown separately in FIG. 6, and the top layer 4 of metal lines, via contacts and gates shown separately in FIG. 7. The horizontal pitch of the metal lines is based upon metal separation requirements and the vertical pitch of the polycrystalline silicon lines is based upon the diffusion widths, polycrystalline silicon widths, and contact requirements. Data signals flow horizontally on metal lines 10, 30, 50 and 70 and 10', 30', 50' and 70' and control signals flow vertically on the polycrystalline silicon lines 15, 35, 55 and 75. This format can be maintained throughout the entire semiconductor chip or the chip may be sectioned into blocks based upon functional requirements. This structured layout approach of the convolved logic invention provides a high degree of flexibility while maintaining a high logic function density.

Figure 5:
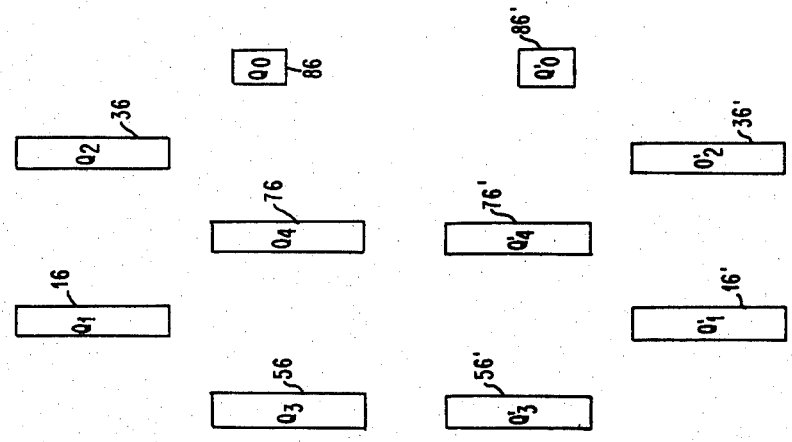
FIG. 5 shows a plan view of the thin gate insulator layer for FIG. 3.
Figure 4:
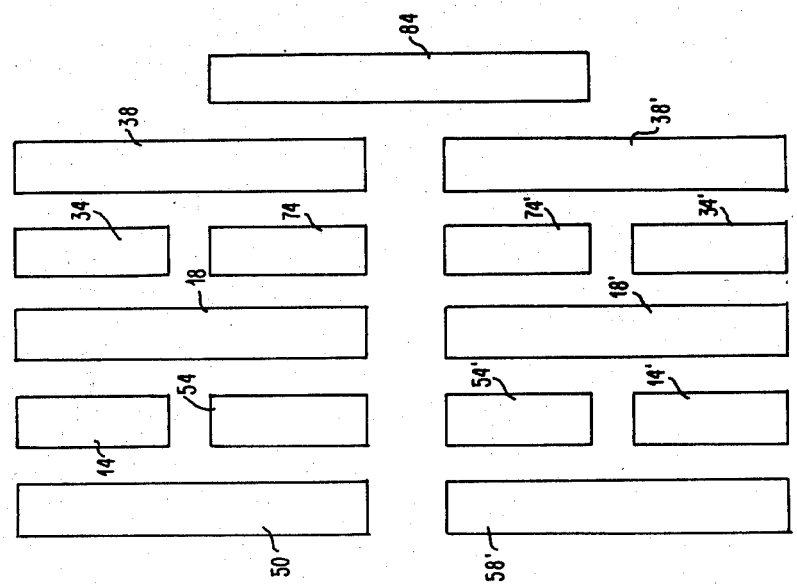
FIG. 4 shows a plan view of the diffusions for FIG. 3.

FIG. 4 shows the diffusions 14 and 18 which, in an N channel technology would be N-type dopant regions in a P-type semiconductor substrate. The region between the diffusions 14 and 18 forms a channel above which will be located the gate region 16 for the device Q1 whose thin oxide region 16 is shown in FIG. 5 and whose polycrystalline silicon gate electrode 15 is shown in FIG. 6. The metal line 10 which delivers the data signal $L_1$ is connected by means of the via hole contact 12 shown in FIG. 7, to the diffusion 14. The diffusion 18 is connected in turn by the via hole contact 20 to the metal line 22 shown in FIG. 7 which is connected to the output node $D_0$. The load device Q0 is formed by the diffusions 38 and 84 in FIG. 4 which are separated by a channel region above which is the thin oxide layer 86 shown in FIG. 5. Q0 and Q0' are metal gate MOSFET devices where the metal line 22 has an extension 45 which overlies the thin oxide region 86 for the device Q0 and serves as the gate for the device Q0. The via hole contact 40 connects the metal extension 45 to the diffusion 38, thereby forming the self-biased depletion mode load device. The channel region of the device Q0 beneath the thin oxide layer 86 is ion-implanted with an N-type dopant to produce the depletion mode characteristics for the device.

In a similar manner, the device Q2 is formed between the diffusions 34 and 38 between which lies the channel region above which is the thin oxide layer 36 shown in FIG. 5. The vertical polycrystalline silicon line 35 lies over the thin oxide layer 36 thereby forming the gate for the FET device Q2, as is shown in FIG. 6. The horizontal metal line 30 delivers the data signal L2 through the via hole contact 32 to the diffusion 34. The diffusion 38 is connected by means of the via hole contact 40 to the output node metal line 22 for the output signal $D_0$.

The FET device Q3 is formed by the diffusions 54 and 58 between which lies a channel region above which is the thin oxide layer 56, shown in FIG. 5. The vertical polycrystalline silicon line 55 shown in FIG. 6 lies over the thin oxide layer 56 for the device Q3 and forms the gate electrode thereof. The horizontal metal line 50 delivers the data signal L3 through the via hole contact 52 to the diffusion 54. The diffusion 58 is connected by means of the via hole contact 60 to the horizontal metal line 22 connected to the output node D0, as is shown in FIG. 7.

The MOSFET device Q4 is formed by the diffusions 18 and 74 in FIG. 4, between which lies a channel region above which is the thin oxide layer 76, shown in FIG. 5. The vertical polycrystalline silicon line 75 shown in FIG. 6 lies over the thin oxide layer 76 for the device Q4, thereby forming the gate electrode thereof. The horizontal metal line 70 shown in FIG. 7 delivers the data signal L4 through the via hole contact 72 to the diffusion 14. The diffusion 18 is connected by means of the via hole contact 20 to the horizontal metal line 22 which is connected to the output node D0.

For the N channel technology, the potential of $V_D$ on the horizontal metal line 80 is relatively positive with respect to ground potential and is connected by means of the via hole contact 81 to the diffusion 84. Ground potential is provided by the horizontal metal line 25.

The natural, bilateral symmetry described for the circuit diagram of FIG. 2 can be seen in the layout of the elements designated by primed numbers and letters shown in FIGS. 4 through 7. Thus it is seen that the practice of maintaining the gated signal flows L1 through L4 perpendicular with respect to the control signal flows G1 through G4 lend the invention to a simplified layout approach which is highly compact and yet quite flexible in adapting to a large variety of complex logical functions.

In comparing FIGS. 3 through 7, the component structures are mutually registered.

Figure 8B:
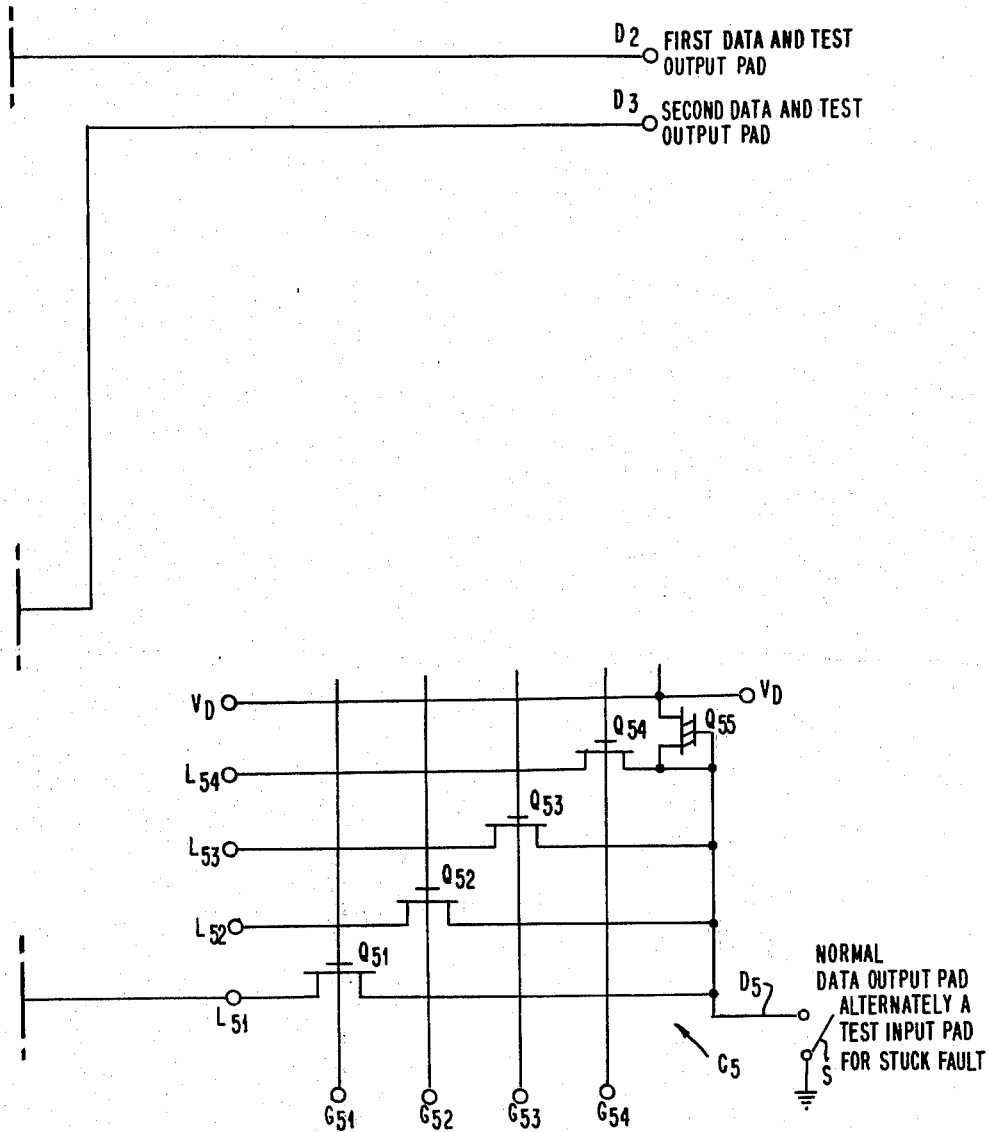

FIG. 8 illustrates one of the significant advantages of the convolved logic invention, namely the ability to perform circuit testing operations by propagating test signals in the reverse direction through data transfer devices, with respect to the direction of data signal propagation during normal operation through those devices. The complex logical function shown in FIG. 8 as embodied in the convolved logic invention, shows five basic convolved logic elements, C1, C2, C3, C4 and C5. For convenience in numbering, each basic convolved logic element $C_i$ is shown with four inputs, $L_i1$, $L_i2$, $L_i3$, and $L_i4$, is shown with four transfer gates $Q_i1$, $Q_i2$, $Q_i3$, and $Q_i4$, is shown with four control lines $G_i1$, $G_i2$, $G_i3$, and $G_i4$, with each circuit having an output node $D_i$. The output node $D_2$ for the circuit $C_2$ has the depletion mode load device $Q_{25}$ connecting it to the drain potential $V_D$. The output node $D_3$ of the circuit $C_3$ has the depletion mode load device $Q_{35}$ connecting it to the drain potential $V_D$. The output node $D_5$ of the circuit $C_5$ has the load device $Q_{55}$ connecting it with the drain potential $V_D$. Three data input devices are shown, $Q_9$ connecting the data line $L_{11}$ to ground potential, $Q_{10}$ connecting the data line $L_{13}$ to ground potential, and $Q_{11}$ connecting the data line $L_{41}$ to ground potential.

During normal operation, the circuit shown in FIG. 8 would carry out a comlex logical function. One part of this complex logical function is the operation of the circuit upon the logical input $\overline{L}$ applied to the gate of the input device $Q_9$. Ignoring all other inputs to the circuit, the output node $D_2$ will receive the inverted logical value of $\overline{L}$ if the control lines $G_{11}$ and $G_{22}$ are on. The output node $D_3$ will receive the inverted value of the logical value of $\overline{L}$ if the control gates $G_{11}$ and $G_{33}$ are on. And the output node $D_5$ will receive the inverted value of the logical value of $\overline{L}$ if $G_{11}$, $G_{44}$ and $G_{51}$ are on.

For example, the output at $D_5$ is produced by the potential at the source of the load device $Q_{55}$ in the circuit $C_5$, which depends upon whether the current which passes through the load device $Q_{55}$ from the drain potential $V_D$ is allowed to pass through the transfer device $Q_{51}$ in the circuit $C_5$, through the transfer device $Q_{44}$ in the circuit $C_4$, and through the transfer device $Q_{11}$ through the circuit $C_1$ to the input device $Q_9$.

To illustrate the operation of the circuit of FIG. 8 during the testing mode, assume that a defect exists in the circuit $C_1$ so that the line $L_{11}$ is interrupted at $F_1$ and the line $L_{13}$ is interrupted at $F_2$. This would produce the defect that an apparent logical value of a binary 1 is always present at the output node $D_1$ corresponding to the drain potential $V_D$. This occurs because no current can be passed from the load devices $Q_{25}$, $Q_{35}$ or $Q_{55}$ back to ground potential to reduce the output voltage level at their respective output nodes $D_2$, $D_3$ or $D_5$. For the embedded arrays as are shown in FIG. 8, it becomes impossible to completely test the circuits $C_2$, $C_3$, $C_4$ or $C_5$. However, by connecting the output node $D_5$ of the circuit $C_5$ through the switch S to ground potential during the testing operation, the ground potential can be transferred through the transfer device $Q_{51}$ and a transfer device $Q_{44}$ to the node $D_1$ of the circuit $C_1$. This enables the current passing through the load device $Q_{25}$ of the circuit $C_2$ to pass through its transfer device $Q_{22}$ to ground potential at the switch S. It also enables the current passing through the load device $Q_{35}$ of the circuit $C_3$ through its transfer device $Q_{33}$ to ground potential at the switch S. Thus the transfer devices such as the device $Q_{22}$ and the circuit $C_2$ can be tested by switching their control gates such as the gate $G_{22}$ in order to detect the test result on the output node $D_2$. Similarly, the transfer device $Q_{33}$ and the circuit $C_3$ can be tested at the output node $D_3$.

It is to be noted that in a testing mode, the transfer devices $Q_{51}$ and $Q_{44}$ are conducting current in a direction which is reversed from that which would obtain during the normal operation of the complex logical function.

Figure 10:
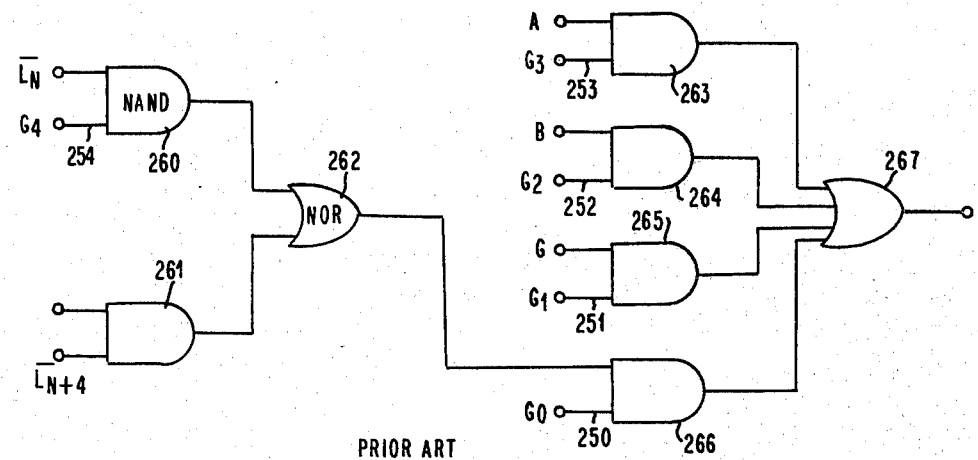
FIG. 10 is a logic block diagram of one bit position in a prior art shifter element.
Figure 9:
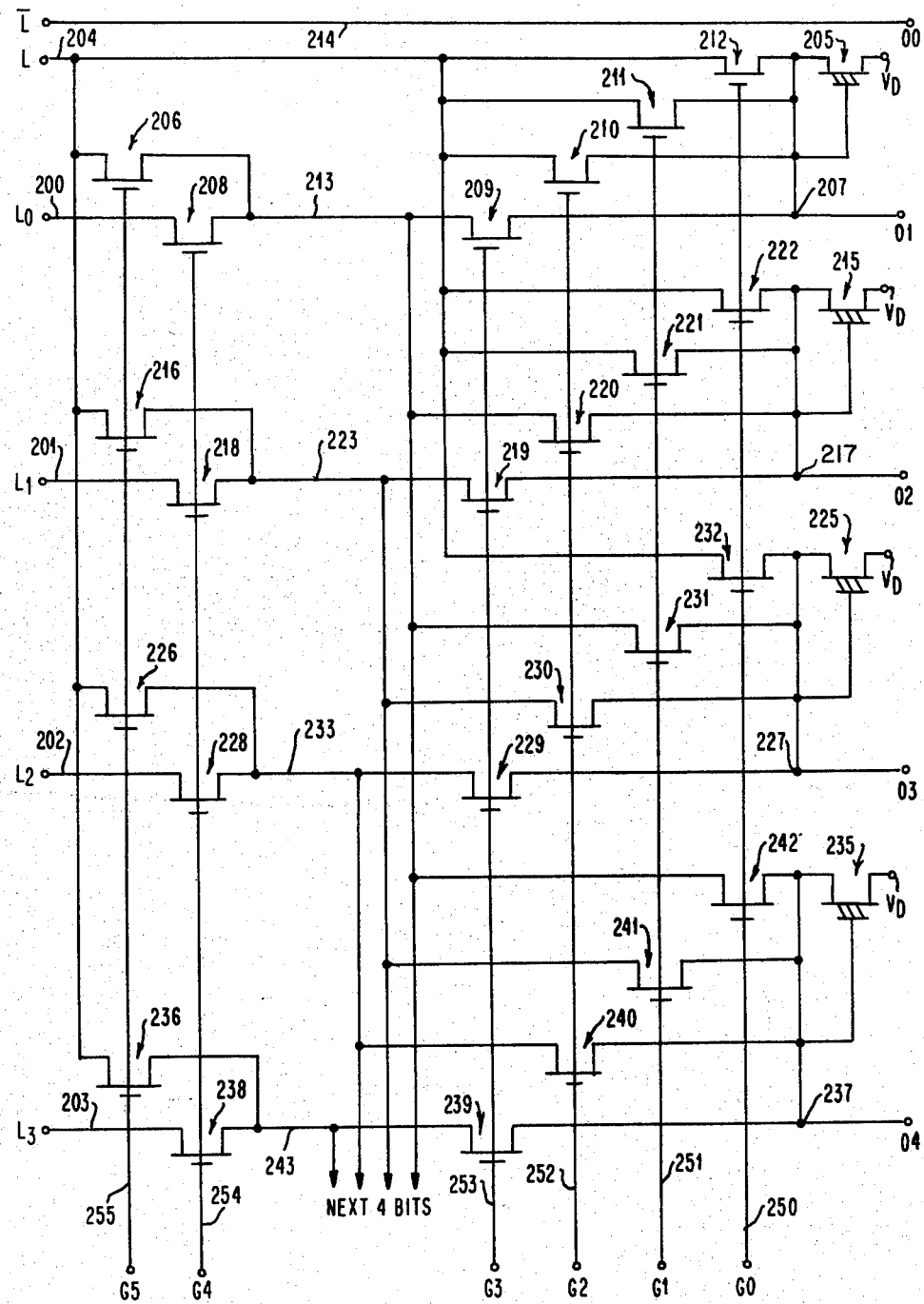
FIG. 9 is a circuit diagram of a convolved logic implementation of a shifter element.

An illustration will now be given of the embodiment of complex logical functions in the convolved logic invention and it will be compared with other types of prior art embodiments of the circuits to illustrate the reduction in component count, the reduction in propagation delay, the reduction in power dissipation, and the reduction in layout area. The illustration is shown in FIG. 9 of the embodiment of a shifter element in the convolved logic invention and it will be compared with the prior art shifter element whose logic diagram is shown in FIG. 10. The element shown in FIG. 9 is capable of performing a shifter function for input signals $L\overline{0}$ through $L\overline{3}$ out to a four bit shift in increments of a single bit based on the selection of control signals G0 through G5. The circuit of FIG. 9 may be used as a four bit shifter or it may be used in parallel with elements of a similar logic construction to shift wide data widths. The logic state Table I defines the control line selection requirements for shifting in the right direction out to four bits and beyond. Table I can be expanded or modified for wider data paths or for left shift operations. The circuit of FIG. 9 illustrates the expansion capabilities for convolved logic in both horizontal and vertical directions.

As is shown in FIG. 9, the orientation of the data lines 200, 201, 202, 203, 204 and 214 is orthogonal with respect to the orientation of the control lines 250, 251, 252, 253, 254 and 255. The horizontal data lines may be embodied as the metal lines shown in FIG. 7 and the vertical control lines may be embodied as the polycrystalline silicon lines of FIG. 6. In an N channel FET embodiment, for example, a positive potential on a control line will render the corresponding transfer device conductive. For the control line 250, when G0 is positive, transfer devices 212, 222, 232, and 242 are conductive. For the control line 251, when G1 is positive, the transfer devices 211, 221, 231, and 241 are conductive. For the control line 252, when G2 is positive, transfer devices 210, 220, 230 and 240 are conductive. For the control line 253, when G3 is positive, transfer devices 209, 219, 229 and 239 are conductive. For the control line 254, when G4 is positive, transfer devices 208, 218, 228 and 238 are positive and will connect the input terminal 200, 201, 202 and 203 respectively to the data lines 213, 223, 233 and 243 respectively. For the control line 255, when G5 is positive, transfer devices 206, 216, 226 and 236 are conductive and respectively connect the data input 204 to the data lines 213, 223, 233 or 243, respectively. Each of the five input terminals 200, 201, 202, 203 and 204 is switchably connected to ground potential so that by selecting combinations of the control lines 250, 251, 252, 253, 254 or 255, the transfer devices will selectively connect the output nodes 207, 217, 227 or 237 to ground potential since the current from the drain potential $V_D$ passing through the respective depletion mode load devices 205, 215, 225 and 235 will be sinked to ground potential through the transfer devices, as previously described.

The operation of the convolved logic implementation of the shifter element shown in FIG. 9 is defined by Table I which is a state table describing the shifter element.

TABLE I

| State Table Describing Shifter Element | | | | | | |
|---|---|---|---|---|---|---|
| G0 | G1 | G2 | G3 | G4 | G5 | Description |
| 0 | 0 | 0 | 1 | 1 | 0 | No Shift |
| 0 | 0 | 1 | 0 | 1 | 0 | Shift Right by 1 |
| 0 | 1 | 0 | 0 | 1 | 0 | Shift Right by 2 |
| 1 | 0 | 0 | 0 | 1 | 0 | Shift Right by 3 |
| 0 | 0 | 0 | 1 | 0 | 1 | |
| 0 | 0 | 1 | 0 | 0 | 1 | Shift Right by Greater Than 4 |
| 0 | 1 | 0 | 0 | 0 | 1 | |
| 1 | 0 | 0 | 0 | 0 | 1 | |

FIG. 10 illustrates a logic diagram of prior shifter elements for one bit. The circuit comprises the NAND gates 260, 261, 263, 264, 265, and 266 and the NOR gates 262 and 267, connected as shown in FIG. 10. Table II compares designs for shifter element in TTL logic, metal gate and polycrystalline silicon gate technologies with the convolved logic implementation shown in FIG. 9, for values of the component count, propagation delay, power dissipation, and layout area. It can be seen by reference to Table II that substantial improvements have been made in each of these characteristics for the convolved logic embodiment of the shifter element shown in FIG. 9, when compared with the three prior art circuit embodiments.

TABLE II

| | Shifter Element | | | | |
|---|---|---|---|---|---|
| Comparative Designs | TTL Logic | Metal Gate | Poly Gate | Convolved Logic | Units |
| Component Count | 279 | 64 | 64 | 28 | Components |
| Propagation Delay (Nom) | 40 ns | 80 ns | 35 | 10 | ns |
| Power (Nom) | 150 | 6.2 | 3.0 | 1.2 | mw |
| Layout Area | 10 FP$^s$ | 1350 | 230 | 32 | mil$^2$ |

Other functions can be implemented as convolved logic elements. These include comparators, decoders, line selectors, adder elements, and control circuitry.

As can be seen from the above, the convolved logic concept provides the following advantages:

1. Removes non-data control elements from the digital data path. This is accomplished by incorporating non-thresholded path rounting thereby eliminating extraneous logic rise/fall times in the critical data path. This concept optimizes data-oriented processor throughput.

2. Incorporates transfer-gate logic functions in a static mode permitting enhanced simulation test-generation abilities.

3. Enhances silicon packing density in poly/al MOSFET technology because of its unique ability to utilize orthogonal poly/al/diffusion layout structures.

4. Is inherently compatible with high level logic design approaches (macrologic LSI) by embodying features of expandability, control/data orthogonality, and output-independence. It has been suggested that the natural data-routing properties of convolved logic strongly complement the natural sequential implementation properties of PLA macros.

While a specific embodiment of the invention has been disclosed, it will be understood by those of skill in the art that the foregoing and other changes in form and details may be made therein without departing from the spirit and the scope of the invention.

Having thus described our invention, what we claim as new, and desire to secure by Letters Patent is:

1. An FET logic circuit including a plurality of convolved logic arrays, each array having non-thresholded path routing to eliminate logic transition times in the critical data path, for enabling stuck fault testing of embedded ones of said arrays, comprising:

a first convolved logic array including a first FET data input device having its gate connected to a first data input source and its source/drain path connected between a first data path and a first reference potential;

a second FET data input device in said first array, having its gate connected to a second data input source and its source/drain path connected between a second data path and said first reference potential;

a first FET transfer device in said first array, having its source/drain path connected in said first data path between said first data input device and an output node of said first array, having its gate input connected to a first control signal path of said first array;

a second FET transfer device in said first array, having its source/drain path connected in said second data path between said second data input device and said output node of said first array, having its gate input connected to a second control signal path of said first array;

a second convolved logic array including a first FET transfer device having its source/drain path connected in a first data path between said output node of said first array and an output node of said second array, having its gate input connected to a first control signal path of said second array;

a second FET transfer device in said second array, having its source/drain path connected in a second data path between a second data input of said second array and said output node of said second array, having its gate input connected to a second control signal path of said second array;

an FET load device in said second array, connected between a second reference potential and said output node of said second array;

said output node of said second array connected to a first output terminal of said circuit which serves as a first data output in a normal operating mode when a current selectively flows from said load device through said first transfer device in said second array and through said first transfer device of said first array to said first reference potential;

a third convolved logic array including a first FET transfer device having its source/drain path connected in a first data path between said output node of said first array and an output node of said third array, having its gate input connected to a first control signal path of said third array;

a second FET transfer device in said third array, having its source/drain path connected in a second data path between a second data input of said third array and said output node of said third array, having its gate input connected to a second control signal path of said third array;

an FET load device in said third array, connected between said second reference potential and said output node of said third array;

said output node of said third array connected to a second output terminal of said circuit which serves as a second data output in a normal operating mode when a current selectively flows from said load device of said third array through said first transfer device in a first direction in said third array and through said first transfer device of said first array to said first reference potential;

a switch selectively connected between said output node of said third array and said first reference potential, for remaining in an open state during said normal mode and for closing during a testing mode to enable testing for a stuck fault at said output node of said first array by allowing a current to selectively flow from said load device in said second array through said first transfer device in said second array and through said first transfer device in a second direction in said third array and through said switch to said first reference potential, the test result being output at said output node of said second array;

whereby stuck fault testing of embedded ones of said arrays can be selectively performed.

2. A binary bit shifter circuit having a non-thresholded path routing to eliminate logic transition times in the critical data path, comprising:

a first convolved logic array having a first data bit input selectively connected to a first reference potential;

a first FET load device in said first array, connected between a second reference potential and an output node of said first array;

a first FET transfer device in said first array, having its source/drain path connected in a first data path between said first data bit input and said output of said first array, having its gate input connected to a first control signal path, for selectively transferring a current from said first load device to said first data bit input;

a second convolved logic array having a second data bit input selectively connected to said first reference potential;

a second FET load device in said second array, connected between said second reference potential and an output node of said second array;

a first FET transfer device in said second array, having its source/drain path connected in a first data path between said second data bit input and said output of said second array, having its gate input connected to said first control signal path, for selectively transferring a current from said second load device to said second data bit input;

a second FET transfer device in said second array, having its source/drain path connected in a second data path between said first data bit input and said output of said second array, having its gate input connected to a second control signal path, for selectively transferring a current from said second load device to said first data bit input;

a third convolved logic array having a third data bit input selectively connected to said first reference potential;

a third FET load device in said third array, connected between said second reference potential and an output node of said third array;

a first FET transfer device in said third array, having its source/drain path connected in a first data path between said third data bit input and said output of said third array, having its gate input connected to said first control signal path, for selectively transferring a current from said third load device to said third data bit input;

a second FET transfer device in said third array, having its source/drain path connected in a second data path between said second data bit input and said output of said third array, having its gate input connected to said second control signal path, for selectively transferring a current from said third load device to said second data bit input;

a third FET transfer device in said third array, having its source/drain path connected in a third data path between said first data bit input and said output of said third array, having its gate input connected to a third control signal path, for selectively transferring a current from said third load to said first data bit input;

a fourth convolved logic array having a fourth data bit input selectively connected to said first reference potential;

a fourth FET load device in said fourth array, connected between said second reference potential and an output node of said fourth array;

a first FET transfer device in said fourth array, having its source/drain path connected in a first data path between said fourth data bit input and said output of said fourth array, having its gate input connected to said first control signal path, for selectively transferring a current from said fourth load device to said fourth data bit input;

a second FET transfer device in said fourth array, having its source/drain path connected in a second data path between said third data bit input and said output of said fourth array, having its gate input connected to said second control signal path, for selectively transferring a current from said fourth load device to said third data bit input;

a third FET transfer device in said fourth array, having its source/drain path connected in a third data path between said second data bit input and said output of said fourth array, having its gate input connected to said third control signal path, for selectively transferring a current from said fourth load to said second data bit input;

a fourth FET transfer device in said fourth array, having its source/drain path connected in a fourth data path between said first data bit input and said output of said fourth array, having its gate input connected to a fourth control signal path, for selectively transferring a current from said fourth load to said first data bit input;

said first control signal path providing a signal for controlling the transfer of a data bit on an $N^{th}$ one of said data bit inputs to the output of an $N^{th}$ one of said arrays, said second control signal path providing a signal for controlling the transfer of a data bit on an $N^{th}$ one of said data bit inputs to the output of an $N+1^{th}$ one of said arrays, said third control signal path providing a signal for controlling the transfer of a data bit on an $N^{th}$ one of said data bit inputs to the outut of an $N+2^{th}$ one of said arrays, and said fourth control signal path providing a signal for controlling the transfer of a data bit on an $N^{th}$ one of said data bit inputs to the output of an $N+3^{th}$ one of said arrays;

whereby a binary bit shifter circuit is formed which will selectively shift the positional significance of binary bits between said inputs and said outputs.

* * * * *